US012094705B2

United States Patent
Jung et al.

(10) Patent No.: US 12,094,705 B2
(45) Date of Patent: Sep. 17, 2024

(54) SUBSTRATE TREATING METHOD AND SUBSTRATE TREATING APPARATUS

(71) Applicant: SEMES CO., LTD., Chungcheongnam-do (KR)

(72) Inventors: Jin Woo Jung, Chungcheongnam-do (KR); Myung Seok Cha, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/892,214

(22) Filed: Aug. 22, 2022

(65) Prior Publication Data

US 2023/0081833 A1    Mar. 16, 2023

(30) Foreign Application Priority Data

Sep. 13, 2021  (KR) .................. 10-2021-0121482

(51) Int. Cl.
*H01L 21/02* (2006.01)
*H01L 21/67* (2006.01)

(52) U.S. Cl.
CPC .. *H01L 21/02101* (2013.01); *H01L 21/67034* (2013.01); *H01L 21/67057* (2013.01)

(58) Field of Classification Search
CPC ......... H01L 21/02101; H01L 21/00–86; H01L 21/67017–67086; B08B 9/00–46;
(Continued)

(56) References Cited

U.S. PATENT DOCUMENTS

| 2003/0197852 | A1* | 10/2003 | Johnson | ................ G01N 15/04 356/37 |
| 2004/0166679 | A1* | 8/2004 | Kishkovich | ....... H01L 21/67253 438/689 |
| 2007/0117383 | A1* | 5/2007 | Aitchison | ......... C23C 16/45525 118/715 |

FOREIGN PATENT DOCUMENTS

EP      0046740     *  3/1982
JP      2661854 B2    10/1997
(Continued)

OTHER PUBLICATIONS

Notice of Reasons for Refusal issued by the Japanese Patent Office on Oct. 3, 2023 in corresponding JP Patent Application No. 2022-135308, with English translation.
(Continued)

*Primary Examiner* — Mikhail Kornakov
*Assistant Examiner* — Richard Z. Zhang
(74) *Attorney, Agent, or Firm* — Carter, DeLuca & Farrell LLP

(57) ABSTRACT

Provided is a substrate treating apparatus including: a fluid supply unit supplying a supercritical fluid to the treatment space, a plurality of components installed in the fluid supply line; and a detection member detecting whether or not metal particles are released from the component. The detection member includes: an upstream detection port connected to the fluid supply line upstream from a first component which is one of the plurality of components; a downstream detection port connected to the fluid supply line downstream from the first component; and a detector provided to be coupled to a selected detection port between the upstream detection port and the downstream detection port, and detecting metal particles from a fluid flowing through the detection port from the fluid supply line.

7 Claims, 11 Drawing Sheets

(58) Field of Classification Search
CPC ........... B08B 3/00–14; F16L 15/00–08; G01N 15/00–1492; G01N 2015/0003–1497
See application file for complete search history.

(56) References Cited

FOREIGN PATENT DOCUMENTS

| | | | |
|---|---|---|---|
| JP | 2003-215002 A | | 7/2003 |
| JP | 2012026792 | * | 2/2012 |
| JP | 2021-052038 A | | 4/2021 |
| KR | 102103508 B1 | * | 4/2020 |

OTHER PUBLICATIONS

Request for the Submission of an Opinion issued by the Korean Intellectual Property Office on Jun. 14, 2023 in corresponding KR Patent Application No. 10-2021-0121482, with English translation.

* cited by examiner

SUBSTRATE TREATING METHOD AND SUBSTRATE TREATING APPARATUS

CROSS-REFERENCE TO RELATED APPLICATIONS

This application claims priority to and the benefit of Korean Patent Application No. 10-2021-0121482 filed in the Korean Intellectual Property Office on Sep. 13, 2021, the entire contents of which are incorporated herein by reference.

TECHNICAL FIELD

The present invention relates to a substrate treating method and a substrate treating apparatus, and more particularly, to an apparatus and a method of treating a substrate by supplying a fluid to a substrate.

BACKGROUND ART

A semiconductor process includes a process of cleaning a thin film, foreign substances, particles, and the like on a substrate. These processes are performed by placing the substrate on a spin head so that a pattern side faces up or down, supplying a treatment liquid to the substrate while rotating the spin head, and then drying the wafer.

According to one example, a liquid treating chamber for liquid treating the substrate by supplying a treatment liquid to the substrate and a drying chamber for removing the treatment liquid from the substrate by using a supercritical fluid after the liquid treatment are provided, respectively, and the substrate, which has been completely treated in the liquid treating chamber, is loaded into the drying chamber by a transfer robot.

The liquid treating chamber supplies an isopropyl alcohol liquid, which has relatively low surface tension compared to water, to the substrate to replace the liquid on the substrate with the isopropyl alcohol liquid, and the substrate is transferred to the drying chamber in the state where the isopropyl alcohol liquid remains on the surface of the substrate. The drying chamber is supplied with the supercritical fluid to remove isopropyl alcohol on the substrate. Carbon dioxide, which is maintained in a supercritical state at a relatively low temperature and well dissolves isopropyl alcohol remaining on the substrate, is mainly used as the supercritical fluid.

FIG. 1 schematically illustrates a supply unit 800 having a general structure for supplying a supercritical fluid to a drying chamber 900.

The supply unit 800 includes a supply tank 820 in which the supercritical fluid is stored, a fluid supply line 840 connecting the supply tank 820 and the drying chamber 900, and a plurality of components 860 installed on the fluid supply line 840. The components 860 may be a valve 862, an orifice 864, a heater 866, or a filter 868, or the like.

In general, the components installed in the fluid supply line that supplies chemical liquids, such as chemicals, are made of materials with strong chemical resistance. In contrast, the components 860 installed in the fluid supply line 840 for supplying the supercritical fluid are made of a material including a metal to withstand high pressure well. When the metal particles generated from the components 860 are supplied to the substrate together with the supercritical fluid during the process, the metal particles remain in the supercritical-treated substrate, thereby causing defects in the substrate. In this case, it is necessary to replace the component 860 from which the metal particle is released among the components 860 installed in the fluid supply line 840, but it is difficult to discover which component among the plurality of components has released the metal particle.

SUMMARY OF THE INVENTION

The present invention has been made in an effort to provide a substrate treating apparatus and a substrate treating method which are capable of easily finding a component releasing metal particles from among various components installed in a fluid supply line when metal particles are contained in a supercritical fluid supplied to a substrate through a fluid supply line.

The object of the present invention is not limited thereto, and other objects not mentioned will be clearly understood by those of ordinary skill in the art from the following description.

An exemplary embodiment of the present invention provides a substrate treating apparatus, including: a chamber having a treatment space treating a substrate; and a fluid supply unit supplying a treatment fluid to the treatment space, in which the fluid supply unit includes: a supply tank in which the treatment fluid is stored; a fluid supply line connecting the supply tank and the chamber and supplying the treatment fluid from the supply tank to the chamber; a plurality of components installed in the fluid supply line; and a detection member detecting whether or not metal particles are released from the component. The detection member may include: an upstream detection port connected to the fluid supply line upstream from a first component which is one of the plurality of components; a downstream detection port connected to the fluid supply line downstream from the first component; and a detector provided to be coupled to a selected detection port between the upstream detection port and the downstream detection port, and detecting metal particles from a fluid flowing through the detection port from the fluid supply line.

According to the exemplary embodiment, the plurality of components may further include a second component adjacent to the first component of one or a plurality of components disposed downstream from the first component, and the downstream detection port may be connected to the fluid supply line between the first component and the second component.

According to the exemplary embodiment, the plurality of components may further include a second component adjacent to the first component of one or a plurality of components disposed upstream from the first component, and the upstream detection port may be connected to the fluid supply line between the first component and the second component.

According to the exemplary embodiment, no other component may be provided between the first component and the upstream detection port and between the first component and the downstream detection port.

According to the exemplary embodiment, the component may include a valve, a pump, a filter, or an orifice.

According to the exemplary embodiment, in the component, a surface exposed to a passage through which a fluid flows may contain a metal, or in the component, a metal surface may be coated with a material other than metal.

According to the exemplary embodiment, the chamber may include a high-pressure vessel, and the fluid may be a supercritical fluid.

According to the exemplary embodiment, the detector may be detachably provided to the upstream detection port and the downstream detection port, and each of the upstream detection port and the downstream detection port may have a cap blocking an end thereof in a state in which the detector is separated.

According to the exemplary embodiment, the upstream detection port and the downstream detection port may be provided to each component installed in the fluid supply line.

Another exemplary embodiment of the present invention provides a substrate treating apparatus, including: a chamber having a treatment space treating a substrate; and a fluid supply unit supplying a supercritical fluid to the treatment space, in which the fluid supply unit includes: a supply tank in which the treatment fluid is stored; a fluid supply line connecting the supply tank and the chamber and supplying the treatment fluid from the supply tank to the chamber; a plurality of components installed in the fluid supply line and made of a material containing metal; and a detection member detecting whether or not metal particles are released from the component. The detection member may include: an upstream detection port connected to the fluid supply line upstream from a first component which is one of the plurality of components; a downstream detection port connected to the fluid supply line downstream from the first component; and a detector provided to be coupled to a selected detection port between the upstream detection port and the downstream detection port, and detecting metal particles from a fluid flowing through the detection port from the fluid supply line, and no other component may be installed between the upstream detection port and the first component, and between the first component and the downstream detection port.

Still another exemplary embodiment of the present invention provides a substrate treating method, including: a substrate treating operation of treating a substrate by supplying a fluid into a treatment space into which the substrate is loaded through a fluid supply line; and a detection operation of detecting whether or not metal particles are released from a component containing metal among components installed in the fluid supply line. The detection operation may include a first component inspection operation of detecting whether or not the metal particles are released from a first component that is one of the components installed in the fluid supply line. The first component inspection operation may include: a first detection operation of obtaining a first detection value by detecting metal particles from a fluid for inspection before passing through the first component by an inspecting device connected to a first detection port installed in the fluid supply line upstream from the first component; a second detection operation of obtaining a second detection value by detecting metal particles from a fluid for inspection after passing through the first component by an inspecting device connected to a second detection port installed in the fluid supply line downstream from the first component; and a first determination operation of determining whether the first component is defective based on the first detection value and the second detection value.

According to the exemplary embodiment, the detection operation may further include a second component inspection operation of detecting whether or not the metal particles are released from the second component that is different from the first component among the plurality of components when the first component is determined to be good in the first component inspection operation. The second component inspection operation may include: a third detection operation of obtaining a third detection value by detecting metal particles from a fluid for inspection before passing through the second component by an inspecting device connected to a third detection port installed in the fluid supply line upstream from the second component among the detection ports installed in the fluid supply line; a fourth detection operation of obtaining a fourth detection value by detecting metal particles from a fluid for inspection after passing through the second component by an inspecting device connected to a fourth detection port installed in the fluid supply line downstream from the second component among the detection ports installed in the fluid supply line; and a second determination operation of determining whether the second component is defective based on the third detection value and the fourth detection value.

According to the exemplary embodiment, the detection operation may include a second component inspection operation of detecting whether the metal particles are released from the second component that is different from the first component among the plurality of components when the first component is determined to be good in the first component inspection operation, and the second component may be disposed in the fluid supply line downstream from the first component, and no other component may be provided between the first component and the second component. The second component inspection operation may include: a third detection operation of obtaining a third detection value by detecting metal particles from a fluid for inspection after passing through the second component by an inspecting device connected to a third detection port installed in the fluid supply line downstream from the second component among the detection ports installed in the fluid supply line; and a second determination operation of determining whether the second component is defective based on the second detection value and the third detection value.

According to the exemplary embodiment, the inspecting device may be provided to be coupled to each of the detection ports, and among the detection ports, the detection ports to which the inspecting device is not coupled may have ends blocked by caps.

According to the exemplary embodiment, the fluid supply line may supply a fluid from a supply tank to the treatment space, and the first component may be a component that is disposed closest to the supply tank among the components containing the metal.

According to the exemplary embodiment, the fluid may be a supercritical fluid.

According to the exemplary embodiment, the treatment of the substrate may be a treatment of drying the substrate by using the supercritical fluid.

According to the exemplary embodiment, the substrate treating method may further include, after the substrate treating operation, an inspection operation of inspecting whether or not metal particles remain on the substrate, in which when the metal particles remain on the substrate by a set value or more in the inspection operation, the detection operation may be performed.

According to the exemplary embodiment of the present invention, it is possible to easily find a component releasing metal particles among components when a fluid is supplied from a fluid supply line in which the components containing metal particles are installed.

Further, according to the present invention, when a substrate is treated by supplying a fluid to the substrate from a fluid supply line in which components containing metal parties are installed, the metal particles released from the component are supplied to the substrate together with the fluid, thereby preventing the metal particles from remaining on the substrate.

The effect of the present invention is not limited to the foregoing effects, and those skilled in the art may clearly understand non-mentioned effects from the present specification and the accompanying drawings.

DETAILED DESCRIPTION

Figure 1:
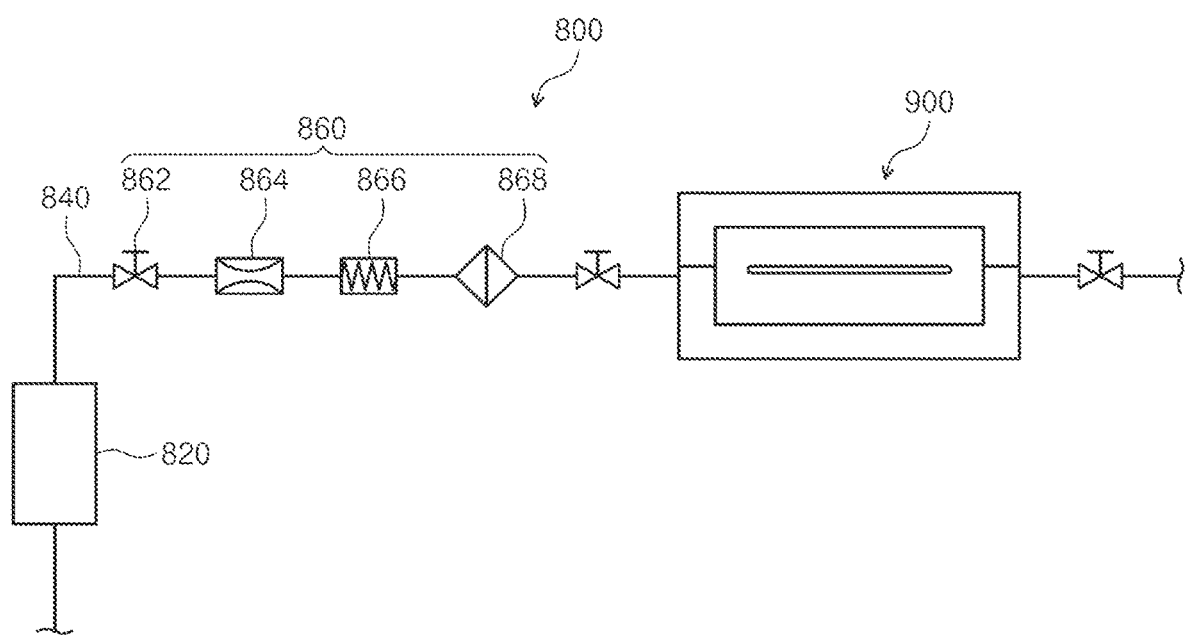
FIG. 1 is a diagram schematically illustrating a fluid supply unit provided in a general substrate treating apparatus.

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Therefore, the shapes of elements in the drawings are exaggerated to emphasize a clearer description.

In the following embodiment, the technical idea of the present invention will be described by taking an apparatus for performing a process of cleaning and drying a substrate as an example. However, the technical spirit of the present invention is not limited to the following embodiments, and may be applied to an apparatus for supplying another type of fluid other than a supercritical fluid, or to an apparatus for performing another type of process other than a process of cleaning or drying a substrate.

Figure 2:
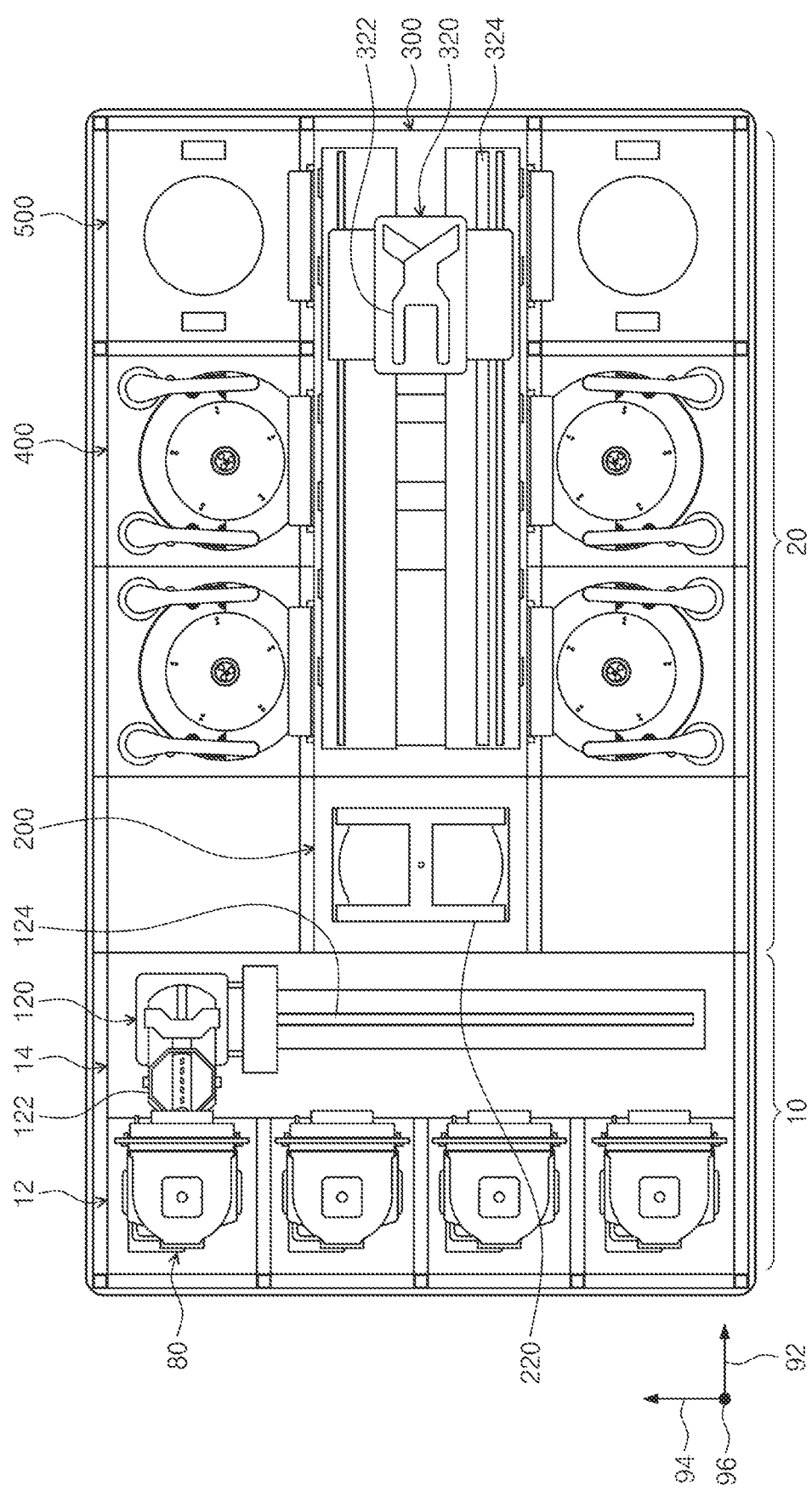
FIG. 2 is a top plan view schematically illustrating a substrate treating apparatus according to an exemplary embodiment of the present invention.

FIG. 2 is a top plan view schematically illustrating a substrate treating apparatus according to an exemplary embodiment of the present invention.

Referring to FIG. 2, a substrate treating apparatus includes an index module 10, a treating module 20, and a controller 30. According to the exemplary embodiment, the index module 10 and the treating module 20 are disposed along one direction. Hereinafter, the direction in which the index module 10 and the treating module 20 are disposed is referred to as a first direction 92, and when viewed from above, a direction vertical to the first direction 92 is referred to as a second direction 94, and a direction vertical to both the first direction 92 and the second direction 94 is referred to as a third direction 96.

The controller 30 may control the substrate treating apparatus. The controller 30 may control the index module 10 and the treating module 20. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, a control program for executing the process executed in the substrate treating apparatus under the control of the process controller, and a program for executing the process in each component according to various data and treatment conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The index module 10 transfers a substrate W from a container 80 in which the substrate W is accommodated to the treating module 20, and makes the substrate W, which has been completely treated in the treating module 20, be accommodated in the container 80. A longitudinal direction of the index module 10 is provided in the second direction 94. The index module 10 includes a load port 12 and an index frame 14. Based on the index frame 14, the load port 12 is located at a side opposite to the treating module 20. The container 80 in which the substrates W are accommodated is placed on the load port 12. The load port 12 may be provided in plurality, and the plurality of load ports 12 may be disposed in the second direction 94.

As the container 80, an airtight container, such as a Front Open Unified Pod (FOUP), may be used. The container 80 may be placed on the load port 12 by a transport means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The index robot 120 includes a hand 122 on which the substrate W is placed, and the hand 122 may be provided to be movable forward and backward, rotatable based on the third direction 96 as an axis, and movable in the third direction 96. A plurality of hands 322 are provided to be spaced apart in the vertical direction, and the hands 322 may move forward and backward independently of each other.

The treating module 20 includes a buffer unit 200, a transfer chamber 300, a liquid treating chamber 400, and a drying chamber 500. The buffer unit 200 provides a space in which the substrate W loaded to the treating module 20 and the substrate W unloaded from the treating module 20 stay temporarily. The liquid treating chamber 400 performs a liquid treating process of treating the substrate W with a liquid by supplying the liquid onto the substrate W. The drying chamber 500 performs the drying process of removing the liquid remaining on the substrate W. The transfer chamber 300 transfers the substrate W between the buffer unit 200, the liquid treating chamber 400, and the drying chamber 500.

The transfer chamber 300 may be provided so that a longitudinal direction is the first direction 92. The buffer unit 200 may be disposed between the index module 10 and the transfer chamber 300. The liquid treating chamber 400 and the drying chamber 500 may be disposed on the side of the transfer chamber 300. The liquid treating chamber 400 and the transfer chamber 300 may be disposed in the second direction 94. The drying chamber 280 and the transfer chamber 240 may be disposed in the second direction 94. The buffer unit 220 may be positioned at one end of the transfer chamber 300.

According to the example, the liquid treating chambers 400 are disposed on both sides of the transfer chamber 300, the drying chambers 500 are disposed on both sides of the transfer chamber 300, and the liquid treating chambers 400 may be disposed closer to the buffer unit 200 than the drying chambers 500. At one side of the transfer chamber 300, the liquid treating chambers 400 may be provided in an arrangement of A×B (each of A and B is 1 or a natural larger than 1) in the first direction 92 and the third direction 96. Further, at one side of the transfer chamber 300, the drying chambers 500 may be provided in number of C×D (each of C and D is 1 or a natural number larger than 1) in the first direction 92 and the third direction 96. Unlike the above, only the liquid treating chambers 400 may be provided on one side of the transfer chamber 300, and only the drying chambers 500 may be provided on the other side of the transfer chamber 300.

The transfer chamber 300 has a transfer robot 320. A guide rail 340 having a longitudinal direction in the first direction 92 is provided in the transfer chamber 300, and the transfer robot 320 may be provided to be movable on the guide rail 340. The transfer robot 320 includes a hand 322 on which the substrate W is placed, and the hand 322 may be provided to be movable forward and backward, rotatable based on the third direction 96 as an axis, and movable in the third direction 96. A plurality of hands 322 are provided to be spaced apart in the vertical direction, and the hands 322 may move forward and backward independently of each other.

The buffer unit 200 includes a plurality of buffers 220 on which the substrate W is placed. The buffers 220 may be disposed while being spaced apart from each other in the third direction 96. A front face and a rear face of the buffer unit 200 are opened. The front face is a face facing the index module 10 and the rear face is a face facing the transfer chamber 300. The index robot 120 may approach the buffer unit 200 through the front face, and the transfer robot 320 may approach the buffer unit 200 through the rear face.

Figure 3:
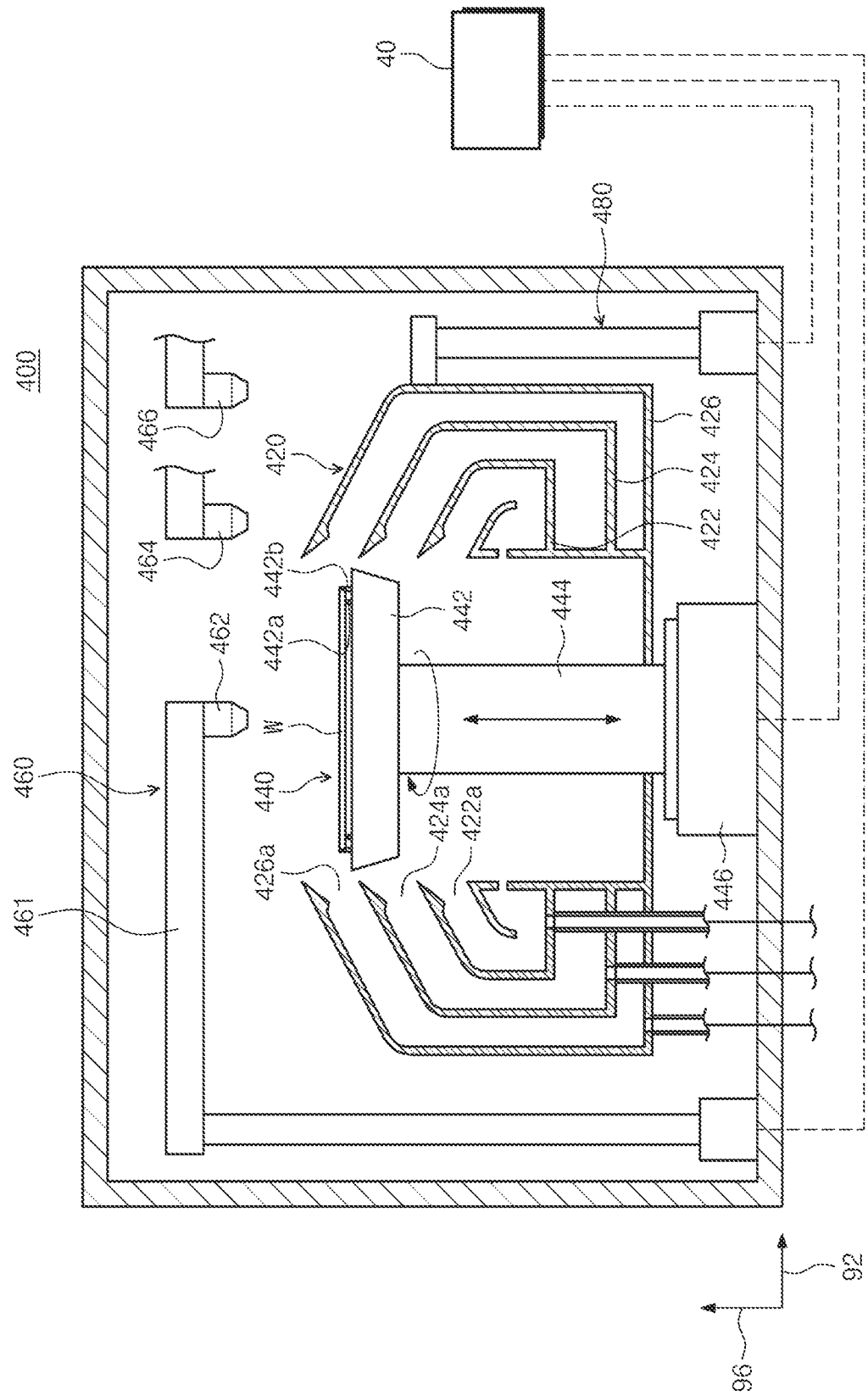
FIG. 3 is a diagram schematically illustrating an exemplary embodiment of a liquid treating chamber of FIG. 2.

FIG. 3 is a diagram schematically illustrating an exemplary embodiment of the liquid treating chamber 400 of FIG. 2. Referring to FIG. 3, the liquid treating chamber 400 includes a housing 410, a cup 420, a support unit 440, a liquid supply unit 460, and a lifting unit 480. The housing 410 is provided in a generally rectangular parallelepiped shape. The cup 420, the support unit 440, and the liquid supply unit 460 are disposed in the housing 410.

The cup 420 has a treatment space with an open top, and the substrate W is liquid-treated in the treatment space. The support unit 440 supports the substrate W in the treatment space. The liquid supply unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to one example, the cup 420 includes a plurality of recovery containers 422, 424, and 426. Each of the recovery containers 422, 424, and 426 has a recovery space of recovering the liquid used for the treatment of the substrate. Each of the recovery containers 422, 424, and 426 is provided in a ring shape surrounding the support unit 440. When the liquid treatment process is in progress, the treatment liquid scattered by the rotation of the substrate W may be introduced into the recovery space through inlets 422a, 424a, and 426a of the respective recovery containers 422, 424, and 426 to be described later. According to one example, the cup 420 includes the first recovery container 422, the second recovery container 424, and the third recovery container 426. The first recovery container 422 is disposed to surround the support unit 440, the second recovery container 424 is disposed to surround the first recovery container 422, and the third recovery container 426 is disposed to surround the second recovery container 424. The second inlet 424a through which the liquid is introduced to the second recovery container 424 may be positioned above the first inlet 422a through which the liquid is introduced to the first recovery container 422, and the third inlet 426a through which the liquid is introduced to the third recovery container 426 may be positioned above the second inlet 424a.

The support unit 440 includes a support plate 442 and a driving shaft 444. An upper surface of the support plate 442 may be provided in a generally circular shape, and may have a diameter larger than a diameter of the substrate W. A support pin 442a supporting the rear surface of the substrate W is provided to a center portion of the support plate 442, and an upper end of the support pin 442a is provided to protrude from the support plate 442 so that the substrate W is spaced apart from the support plate 442 by a predetermined distance. A chuck pin 442b is provided to an edge of the support plate 442. The chuck pin 442b is provided to protrude upward from the support plate 442, and supports the lateral portion of the substrate W so that the substrate W is not separated from the support unit 440 when the substrate W is rotated. The driving shaft 444 is driven by the driver 446, is connected to the center of the bottom surface of the substrate W, and rotates the support plate 442 based on the central axis thereof.

According to one example, the liquid supplying unit 460 includes a first nozzle 462, a second nozzle 464, and a third nozzle 446. The first nozzle 462 supplies a first liquid onto the substrate W. The first liquid may be the liquid of removing a film or foreign substances left on the substrate W. The second nozzle 464 supplies a second liquid onto the substrate W. The second liquid may be the liquid well soluble in a third liquid. For example, the second liquid may be the liquid that is better soluble in the third liquid than the first liquid. The second liquid may be the liquid that neutralizes the first liquid supplied onto the substrate W. Further, the second liquid may be the liquid that neutralizes the first solution and at the same time is better soluble in the third solution than the first solution. According to one example, the second liquid may be water. The third nozzle 466 supplies the third liquid onto the substrate W. The third liquid may be a liquid that is well soluble in the supercritical fluid used in the drying chamber 500. For example, the third liquid may be a liquid that is more soluble in the supercritical fluid used in the drying chamber 500 than the second liquid. According to an example, the third liquid may be an organic solvent. The organic solvent may be isopropyl alcohol. The first nozzle 462, the second nozzle 464, and the third nozzle 466 may be supported by different arms 461, and the arms 461 may be independently moved. Optionally, the first nozzle 462, the second nozzle 464, and the third nozzle 466 may be mounted to the same arm and moved at the same time.

The lifting unit 480 moves the cup 420 in the vertical direction. By the vertical movement of the cup 420, a relative height between the cup 420 and the substrate W is changed. Accordingly, since the recovery containers 422, 424, and 426 for recovering the treatment liquid are changed according to the type of the liquid supplied to the substrate W, the liquids may be separated and collected. Unlike the description, the cup 420 may be fixedly installed, and the lifting unit 480 may move the support unit 440 in the vertical direction.

Figure 4:
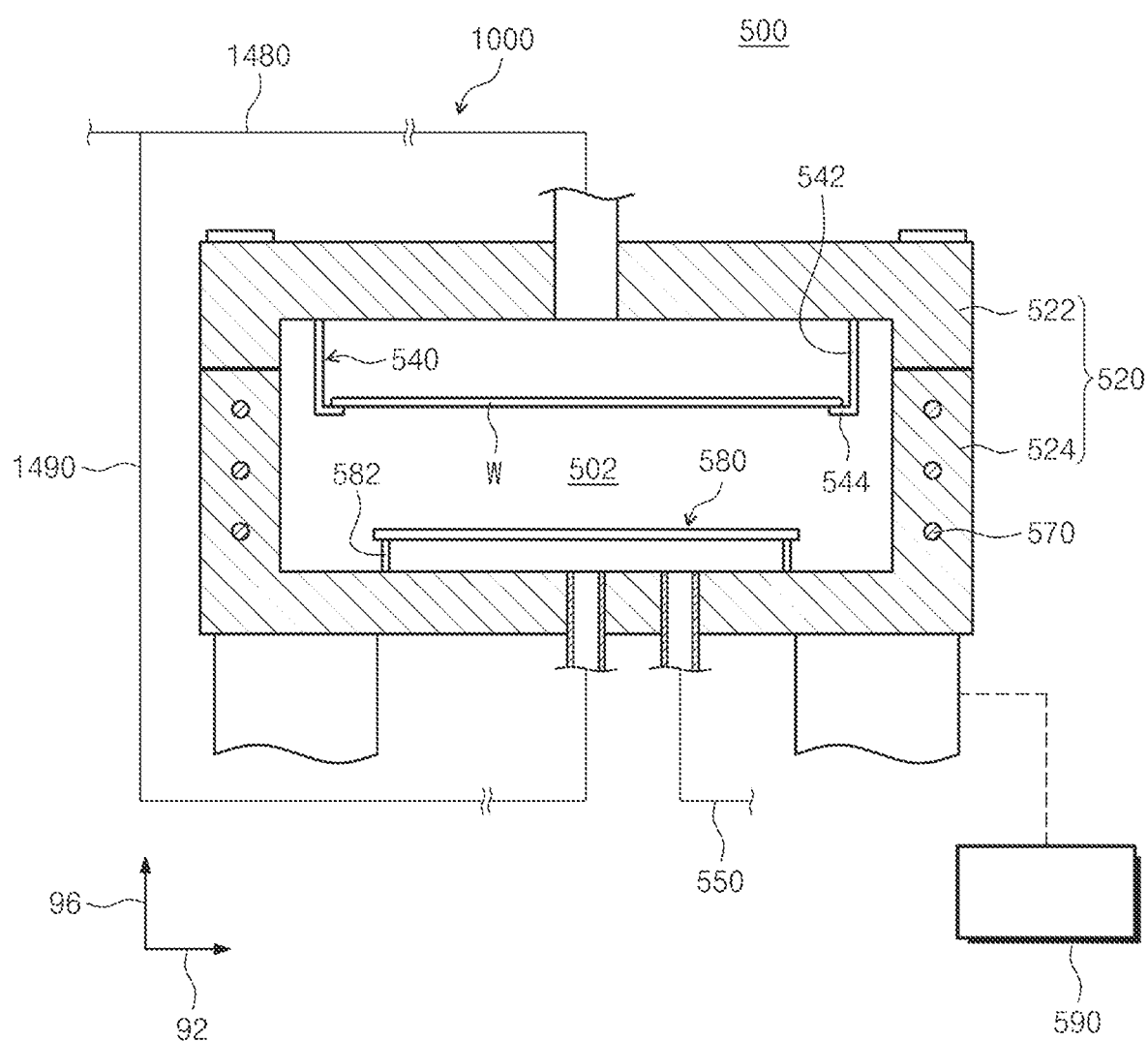
FIG. 4 is a diagram schematically illustrating an exemplary embodiment of a drying chamber of FIG. 2.

FIG. 4 is a diagram schematically illustrating an exemplary embodiment of the drying chamber of FIG. 2. According to the exemplary embodiment, the drying chamber 500 removes a liquid on the substrate W by using a supercritical fluid. The drying chamber 500 includes a body 520, a support body 540, a fluid supply unit 560, a blocking plate 580, and a detection member 590.

The body 520 provides an interior space 502 in which the drying process is performed. The body may be provided as a high pressure container withstanding high pressure. The body 520 has an upper body 522 and a lower body 524. The upper body 522 and the lower body 524 are combined with each other to provide an inner space 502 described above. The upper body 522 is provided above the lower body 524. The position of the upper body 522 is fixed, and the lower body 524 may be raised and lowered by a driving member 590, such as a cylinder or a motor. When the lower body 524 is spaced apart from the upper body 522, the inner space 502 is opened, and at this time, the substrate W is loaded or unloaded. During the process, the lower body 524 is in close contact with the upper body 522, so that the inner space 502 is sealed from the outside. The drying chamber 500 includes a heater 570. According to one example, the heater 570 is located inside the wall of the body 520. The heater 570 heats the inner space 502 of the body 520 so that the fluid supplied into the inner space of the body 520 maintains a supercritical state.

The support body 540 supports the substrate W in the inner space 502 of the body 520. The support body 540 has a fixing rod 542 and a cradle 544. The fixing rod 542 is fixedly installed on the upper body 522 so as to protrude downward from the bottom surface of the upper body 522. The fixing rod 542 is provided so that a longitudinal direction thereof is the vertical direction. A plurality of fixing rods 542 are provided and are positioned to be spaced apart from each other. The fixing rods 542 are disposed so that the substrate W does not interfere with the fixing rods 542 when the substrate W is loaded or unloaded into the space surrounded by the fixing rods 542. The cradle 544 is coupled to each of the fixing rods 542. The holder 544 extends from the lower end of the fixing rod 542 toward the space surrounded by the fixing rods 542. By the above-described structure, the edge region of the substrate W loaded into the internal space 502 of the body 520 is placed on the cradle 544, and the entire upper surface area of the substrate W, a central area in the bottom surface of the substrate W, and a part of an edge area in the bottom surface of the substrate W are exposed to the supercritical fluid supplied to the internal space 502.

A blocking plate 580 may be disposed in the inner space 502 of the body 520. The blocking plate 580 may be provided in a disk shape. The blocking plate 580 is supported by a support 582 so as to be spaced upward from the bottom surface of the body 520. The support 582 is provided in a rod shape, and a plurality of supports 582 are arranged to be spaced apart from each other by a predetermined distance. When viewed from the top, the blocking plate 580 may be provided to overlap an outlet of a lower branch line 1490 and an inlet of the exhaust line 550, which will be described later. The blocking plate 580 may prevent the substrate W from being damaged due to the direct release of the supercritical fluid supplied through the lower branch line 1490 toward the substrate W.

Figure 5:
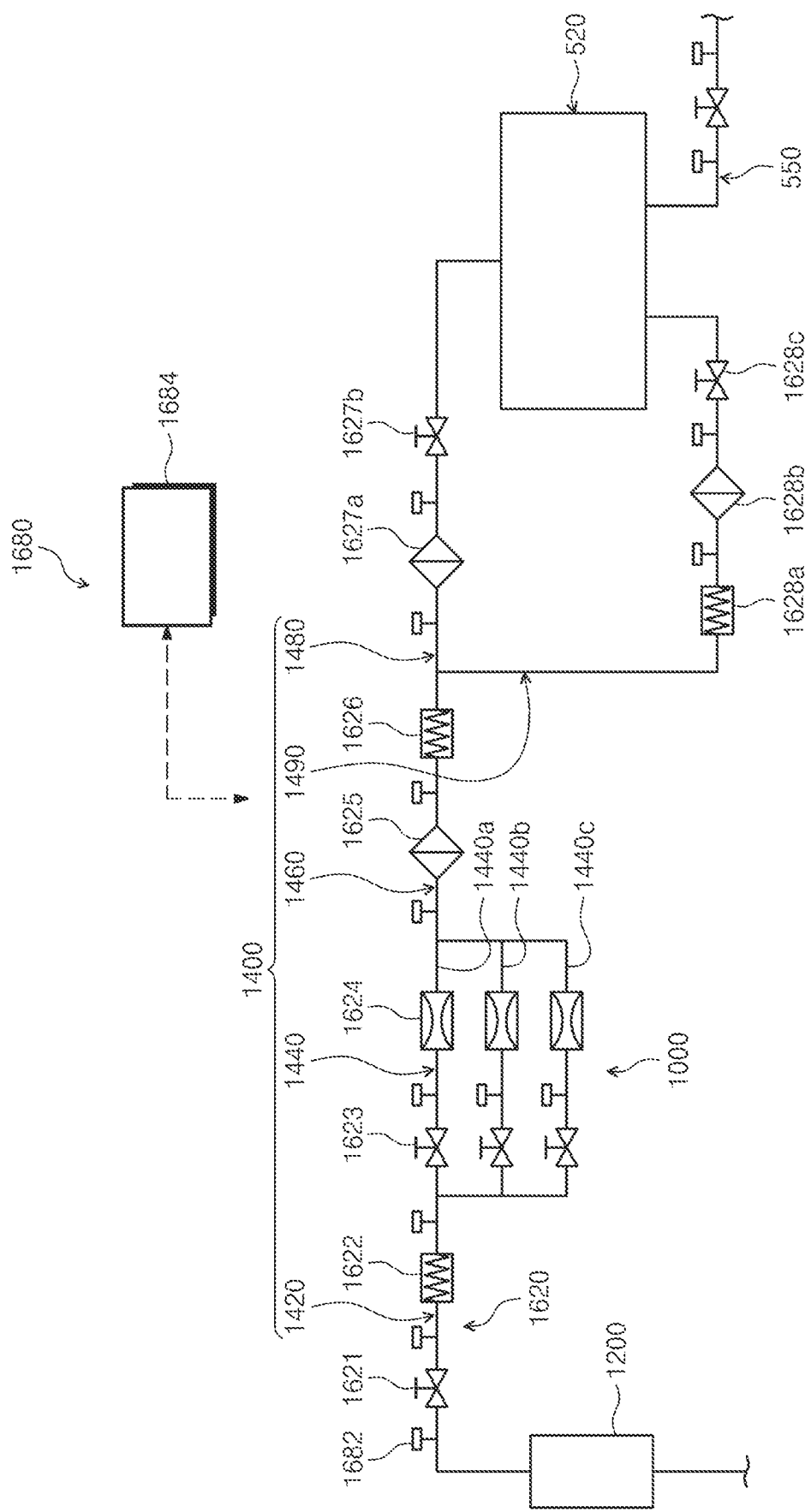
FIG. 5 is a diagram schematically illustrating an example of a fluid supply unit of FIG. 4.

FIG. 5 is a diagram schematically illustrating an example of the fluid supply unit. Referring to FIG. 5, the fluid supply unit 560 supplies a treatment fluid to the inner space 502 of the body 520. The treatment fluid may be a supercritical fluid. According to an example, the supercritical fluid may be supplied to the inner space 502 in a supercritical state. Unlike this, the supercritical fluid may be supplied to the inner space 502 in a gaseous state, and may be phase-changed to a supercritical state in the internal space 502.

The fluid supply unit 560 includes a supply tank 1200, a fluid supply line 1400, and a plurality of components 1620. The supply tank 1200 stores a supercritical fluid. The supercritical fluid may be maintained in a supercritical state within the supply tank 1200. The fluid supply line 1400 connects the supply tank 1200 and the body 520, and the supercritical fluid in the supply tank 1200 is supplied to the inner space of the body 520 through the fluid supply line 1400.

According to an example, the fluid supply line 1400 has a front line 1420, flow rate selection lines 1440, a rear line 1460, an upper branch line 1480, and a lower branch line 1490. The front line 1420 is connected to the supply tank 1200. The flow rate selection lines 1440 are connected to an downstream end of the front line 1420. The flow rate selection lines 1440 may be disposed in parallel with each other. An orifice 1624 or a flow rate control valve (not illustrated) may be installed in each flow rate selection line 1440 so that the flow rates flowing through the flow rate selection lines 1440 are different from each other. The rear line 1460 is connected to the downstream ends of the flow rate selection lines 1440, and the upper branch line 1480 and the lower branch line 1490 are connected to the downstream ends of the rear line 1460.

The upper branch line 1480 is coupled to the upper body 522 to supply the supercritical fluid from the upper portion of the substrate W placed on the support body 540. The lower branch line 1490 is coupled to the lower body 524 to supply the supercritical fluid from the lower portion of the substrate W placed on the support body 540. According to the example, the upper branch line 1480 is coupled to the center of the upper body 522. The exhaust line 550 is coupled to the lower body 524. The supercritical fluid in the internal space 502 of the body 520 is exhausted to the outside of the body 520 through the exhaust line 550. One of the lower branch line 1490 and the exhaust line 550 may be coupled to the center of the lower body 524, and the other may be coupled to the lower body 524 at a position spaced apart from the center of the lower body 524.

A plurality of components 1620 are installed in the fluid supply line 1400. The components 1620 may be valves 1621, 1623, 1627a, or 1628c that open or close the fluid flowing in the fluid supply line 1400 or controls a flow rate. The component 1620 may also be heaters 1622, 1626, and 1628a that heat the fluid flowing through fluid supply line 1400. In addition, the component 1620 may be an orifice 1624 that reduces the area of the flow path in the fluid supply line 1400. Optionally, the components 1620 may be filters 1625, 1627a, 1628b that remove foreign substances from the fluid flowing through the fluid supply line 1400.

According to an example, the valve 1621 and the heater 1622 may be sequentially installed in the front line 1420 in a direction from an upstream side to a downstream side. The valve 1621 may be an on/off valve. Optionally, the valve 1621 may be a flow control valve. The heater 1622 heats the supercritical fluid so that the temperature of the supercritical fluid supplied from the supply tank 1200 becomes a set temperature suitable for the process.

The valve 1623 and the n orifice 1624 may be sequentially installed in each flow rate selection line 1440 in a direction from an upstream side to a downstream side. The valve 1623 may be an on/off valve. The orifices 1624 installed in the flow rate selection lines 1440 are provided so that the areas of the internal passages thereof through which the fluid flows are different from each other. For example, when three flow rate selection lines 1440 are provided, the passage area of the orifice installed in the second flow rate selection line is smaller than the passage area of the orifice installed in the first flow rate selection line, and the passage area of the orifice installed in the third flow rate selection line may be smaller than the passage area of the orifice installed in the second flow rate selection line. When it is desired to change the flow rate of the supercritical fluid supplied into the body 520, the supercritical fluid may be supplied through the flow rate selection line 1440 in which the orifice having a passage area corresponding to the flow rate which is desired to be changed is installed.

The filter 1625 and the heater 1626 may be sequentially installed in the rear line 1460 in the direction from the upstream side to the downstream side. The filter 1625 filters foreign substances from the supercritical fluid. One filter 1625 may be installed, or a plurality of filters may be sequentially provided. When a plurality of filters 1625 are provided, the filters are provided so that the type or size of the foreign material filtered by each filter is different. The heater 1626 may precisely control the temperature of the supercritical fluid, so that the temperature of the supercritical fluid, which is primarily controlled by the heater 1621 installed on the front line 1420, becomes a set temperature.

The filter 1627a and the valve 1627b are sequentially installed in the upper branch line 1480 in the direction from the upstream side to the downstream side. The filter 1627a once again filters foreign matter from the supercritical fluid before the supercritical fluid heated by the heater 1626 installed in the rear line 1460 is supplied into the housing. The valve 1627b may be an on/off valve.

A heater 1628a, a filter 1828b, and a valve 1628c are sequentially installed in the lower branch line 1490 in the direction from the upstream side to the downstream side. Initially, the supercritical fluid flows into the body 520 through the lower branch line 1490, and when the inside of the body 520 becomes a set pressure, the supercritical fluid flows into the body 520 through the upper branch line 1480. The temperature of the supercritical fluid supplied into the body 520 through the lower branch line 1490 and the temperature of the supercritical fluid supplied into the body 520 through the upper branch line 1480 may be controlled to be different from each other by the heater 1628a installed in the lower branch line 1490. The filter 1628b filters foreign substances from the supercritical fluid once again before the supercritical fluid heated by the heater 1628a installed in the lower branch line 1490 is supplied into the body 520.

In the drying chamber 500, the body 520, the fluid supply line 1400, and the components 1620 are provided with a rigid material that can withstand high pressure well. The rigid material may be a metal. The metal may be stainless steel. Each component 1620 may have an inner surface of a passage, through which the supercritical fluid flows, made of a metal material. Optionally, the inner surface of the passage through which the supercritical fluid flows in each component 1620 may be made of a metal material, and the surface of the passage may be provided as a coated surface coated with a material other than metal. When the component 1620 is damaged or the component 1620 is used for a long time, metal particles may be released from the component 1620 during substrate treating using the supercritical fluid. The released metal particles may be supplied into the body 520 together with the supercritical fluid. When the metal particles remain on the substrate, the substrate completely treated by the metal particles may be determined as a defective substrate in a subsequent inspection process.

The detection member 1680 detects a component 1620 releasing metal particles among the components 1620 installed in the fluid supply line 1400. Defect detection may be performed when the substrate is determined to be defective due to metal particles in the process of inspecting the substrate after the substrate treatment is completed by the substrate treating apparatus of the present invention. Optionally, the defect detection may be performed based on a set time or a set date. Optionally, the defect detection may be performed when the number of substrates treated in the substrate treating apparatus reaches a set number.

Figure 6:
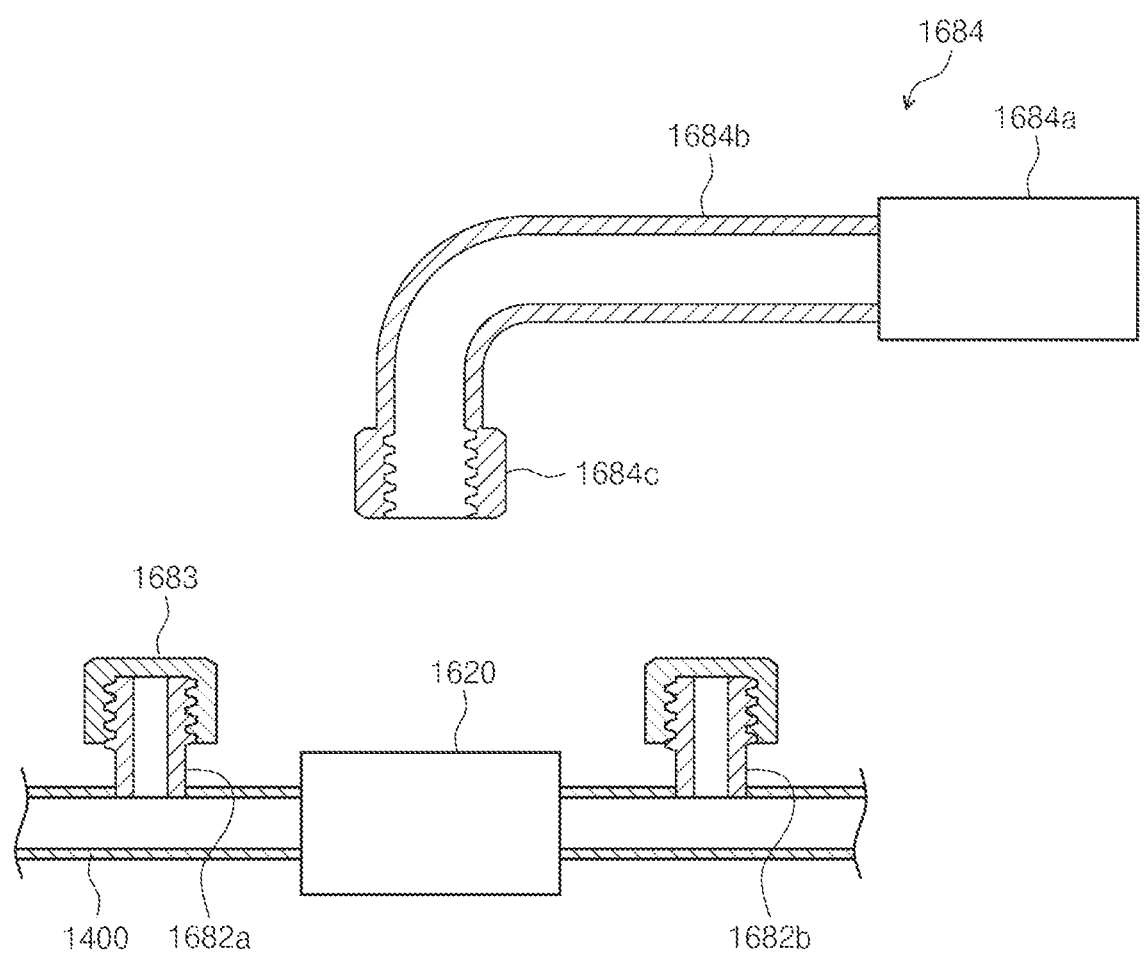
FIG. 6 is a diagram schematically illustrating an example of a detection member provided in the fluid supply unit of FIG. 5.

FIG. 6 is a diagram schematically illustrating an example of the detection member provided in the fluid supply unit of FIG. 5. Referring to FIG. 6, the detection member 1680 has a detection port 1682 and an inspecting device 1684. The detection port 1682 is installed in the fluid supply line 1400. The detection port 1682 may be provided to be branched from the fluid supply line 1400. The end of the detection port 1682 is kept closed by a cap 1683 while the substrate is treated. According to one example, the cap 1683 may be screwed onto the end of the detection port 1682.

According to one example, the detection port 1682 may be installed in each fluid supply line 1400 between the adjacent components of the components 1620, upstream the component 1621 provided most upstream in the fluid supply line 1400, and downstream the components 1627b and 1628c provided most downstream in the fluid supply line 1400. Optionally, the detection port 1682 may be installed in the fluid supply line 1400 so as to be provided only on both sides of the selected components 1620 among the components 1620.

The inspecting device 1684 has a measuring unit 1684a, an inlet line 1684b, and a coupling port 1684c. The measuring unit 1684a detects metal particles from the fluid introduced therein. The coupling port 1684c is provided to be coupled to an end of the detection port 1682. According to one example, the coupling port 1684c may be provided to be screwed with the detection port 1682. The inlet line 1684b connects the measuring unit 1684a and the coupling port 1684c. A portion of the fluid flowing through the fluid supply line 1400 flows into the measuring unit 1684a through the inlet line 1684b. The inspecting device 1684 may detect whether the fluid flowing into the measuring unit 1684a contains metal particles, the number of metal particles, or the type of metal. The fluid flowing through the fluid supply line 1400 during inspection may be the same supercritical fluid as that when the substrate is treated. Optionally, the fluid flowing through the fluid supply line 1400 during the inspection may use a fluid other than the supercritical fluid. Hereinafter, the fluid used for the inspection is referred to as the fluid for inspection.

Figure 7:
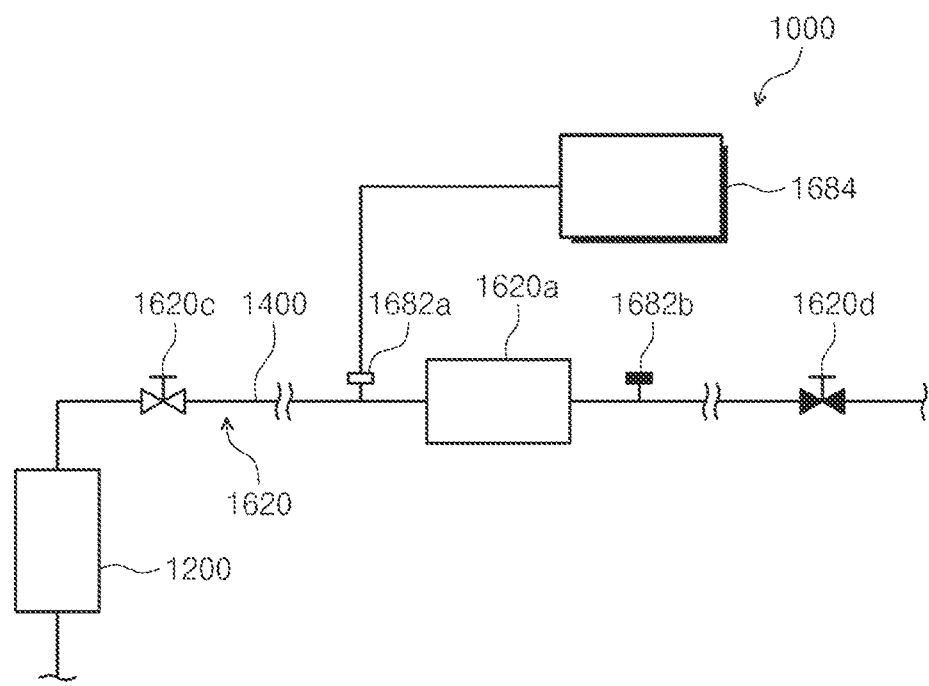
FIGS. 7 and 8 are diagrams illustrating a process of detecting whether a metal foreign material is released from an inspected component among components installed in the fluid supply line.
Figure 8:
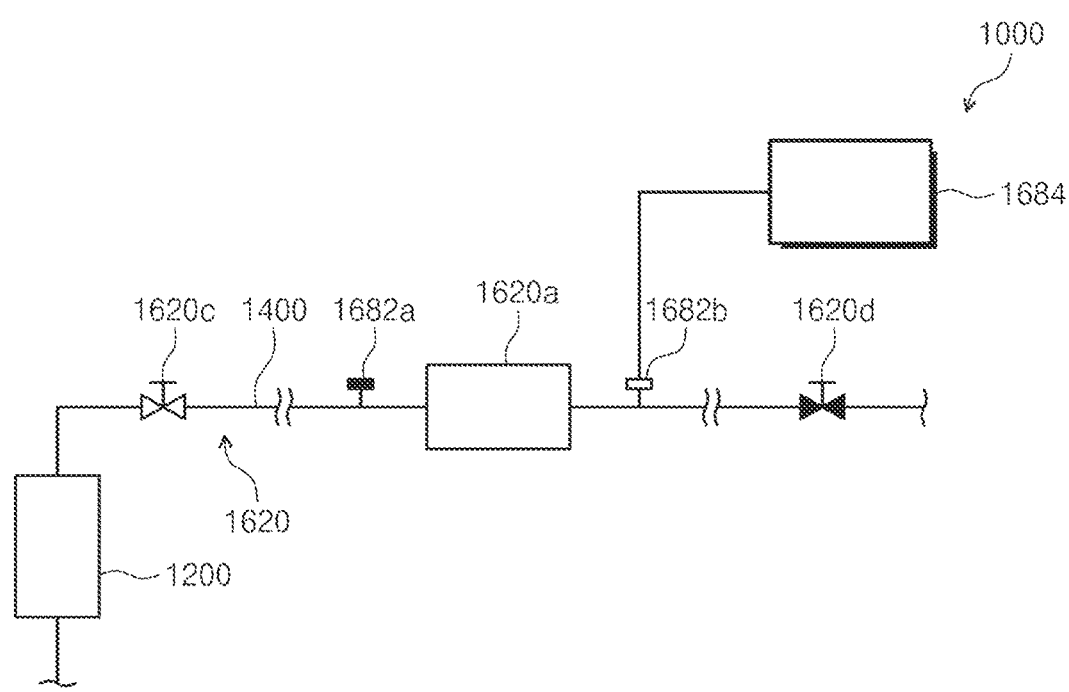

FIGS. 7 and 8 are diagrams illustrating a process of detecting whether a metal foreign material is released from an inspected component among the components installed in the fluid supply line. In FIGS. 7 and 8, the valve with the filled inside is in a closed state, and the valve with the empty inside is in an open state. In addition, an end of the detection port with the filled inside is in a closed state, and an end of the detection port with an empty inside is in an open state. Hereinafter, the component 1620 on which defect detection is performed is referred to as an inspected component. Inspection of the inspected component is performed as follows.

As illustrated in FIG. 7, the coupling port 1684c of the inspecting device 1684 is connected to the upstream detection port 1682a closest to the inspecting component 1620 among the detection ports 1682 located upstream from the inspected component 1620a, and the remaining detection ports 1682b are covered by the caps 1683. Further, among the valves disposed downstream from the inspected component 1620, the valve 1620d installed at the position closest to the inspected component 1620a is closed, and the valves 1620c disposed upstream from the inspected component 1620 are all open. Thereafter, the fluid for inspection is supplied from the supply tank 1200 through the fluid supply line 1400. Some of the fluids for inspection are introduced into the measuring unit 1684a, and the measuring unit 1684a measures the presence or absence of metal particles or the number of metal particles.

Thereafter, as illustrated in FIG. 8, the coupling port 1684c is separated from the upstream detection port 1682a, and the upstream detection port 1682a is blocked with the cap 1683. Thereafter, the coupling port 1684c of the inspecting device 1684 is connected to the downstream detection port 1682b closest to the inspected component 1620 among the detection ports 1682 located downstream from the inspected component 1620a, and the remaining detection ports 1682a are covered by the caps 1683. Further, among the valves disposed downstream from the inspected component 1620, the valve 1620d installed at the position closest to the inspected component 1620a is closed, and the valves 1620c disposed upstream from the inspected component 1620 are all open. The fluid for inspection is supplied from the supply tank 1200 to the fluid supply line 1400. Some of the fluids for inspection are introduced into the measuring unit 1684a, and the measuring unit 1684a measures the presence or absence of metal particles or the number of metal particles. It is determined whether the inspection part 1620a is defective based on a first detection value measured by the upstream detection port 1682a and a second detection value measured by the downstream detection port 1682b. For example, when a difference between the first detection value and the second detection value is equal to or greater than a set value, the inspected component part 1620a may be determined to be defective. Optionally, when metal is not detected in the first detection value and metal is detected in the second detection value, the inspected component 1620a may be determined to be defective.

According to an example, the inspection order of the inspected component 1620a may be determined in the following way. Hereinafter, the present disclosure will be described based on the case where all of the components 1620 installed in the fluid supply line 1400 includes metals. Contrary to this, when the component 1620 that does not contain a metal among the components 1620 installed in the fluid supply line 1400 is installed, the inspected component 1620 below may be specified as a component 1620 containing a metal.

Among the components 1620, the component 1620 closest to the supply tank 1200 is used as a first inspected component 1620a to check whether the component is defective. When it is determined that the first inspected component 1620a is defective, the inspection is stopped and the first inspected component 1620a is replaced with a new component. When it is determined that the first inspected component 1620 is good, the component 1622 closest to the first inspected component 1620a in the downstream direction of the fluid supply line 1400 is used as a second inspected component 1620b to check whether the component is defective. When it is determined that the second inspected component 1620b is defective, the inspection is stopped and the second inspected component 1620b is replaced with a new component. When it is determined that the second inspected component 1620b is good, the component 1623a closest to the second inspected component 1620b in the downstream direction of the fluid supply line 1400 is used as a third inspected component 1620c to check whether the component is defective. The above process is repeated for the components 1620 installed in the fluid supply line 1400 until the component 1620 determined to be defective among the inspected components is found. In the case of the flow rate selection lines 1440, the component 1620 installed in each flow rate selection line 1440 are sequentially inspected for the plurality of flow rate selection lines 1440. The second detection value measured by the measuring unit 1684a by using the downstream detection port 1682d when the first inspected component 1620a is inspected may be used as the first detection value when the inspection on the second inspected component 1620b is performed.

FIGS. 9 to 12 are diagrams sequentially illustrating an exemplary embodiment of a defect detecting method according to the exemplary embodiment of the present invention.

Figure 9:
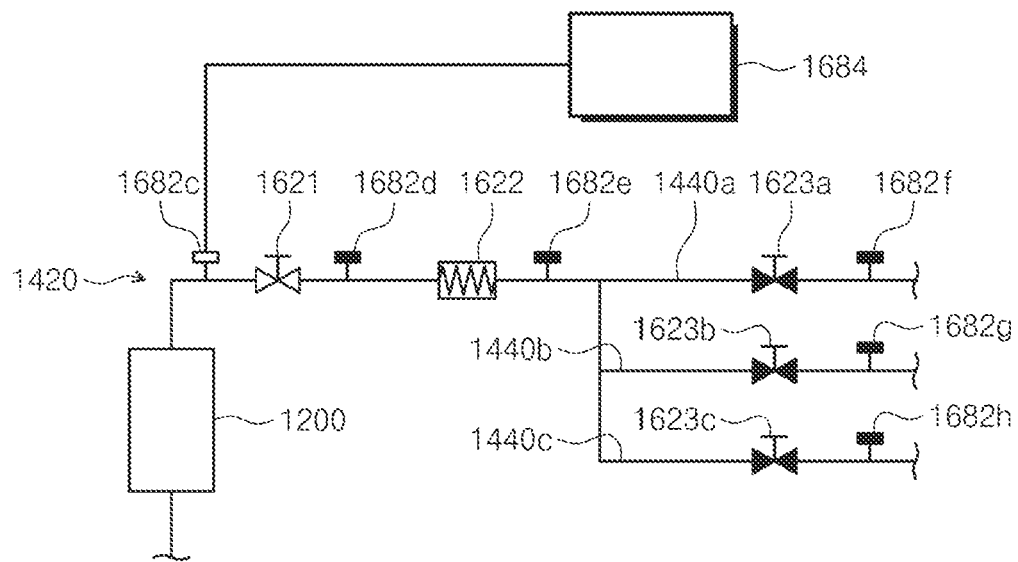
FIGS. 9 to 12 are diagrams sequentially illustrating an exemplary embodiment of a defect detecting method according to the exemplary embodiment of the present invention.

As illustrated in FIG. 9, the first valve 1621 located closest to the supply tank 1200 is selected as an inspected component. Metal particles are detected by connecting the inspecting device 1684 to the first detection port 1682c closest to the first valve 1621 upstream the first valve 1621.

Figure 10:
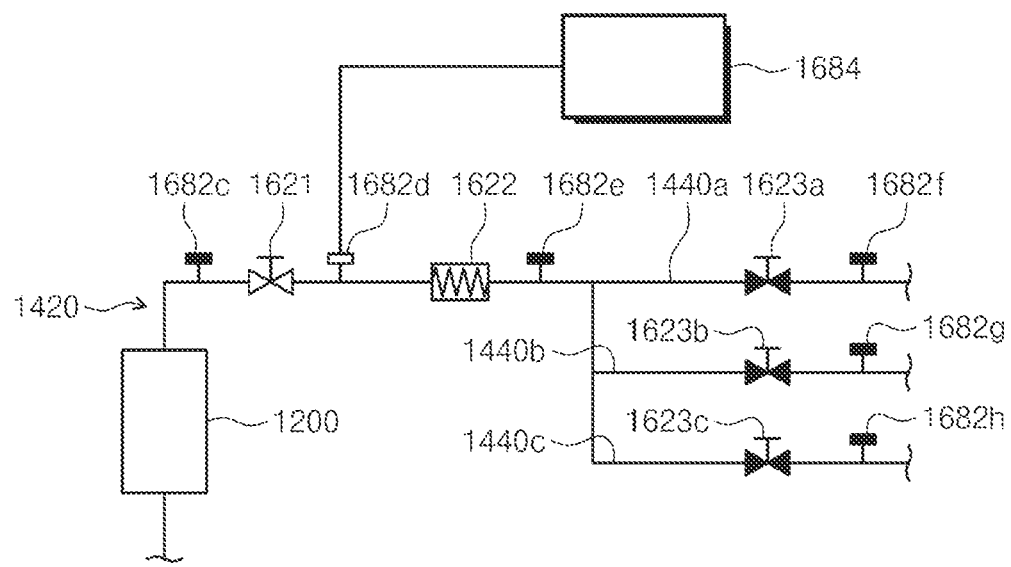

Thereafter, as illustrated in FIG. 10, metal particles are detected by connecting the inspecting device 1684 to the second detection port 1682d closest to the first valve 1621 downstream from the first valve 1621. Whether or not the first valve 1621 is defective is determined based on the first detection value detected from the first detection port 1682c and the second detection value detected from the second detection port 1682d. When it is determined that the first valve 1621 is defective, the inspection is terminated and the first valve 1621 is replaced. When it is determined that the first valve 1621 is good, the first heater 1622, which is a component closest to the first valve 1621 downstream from the first valve 1621, is selected as an inspected component.

Figure 11:
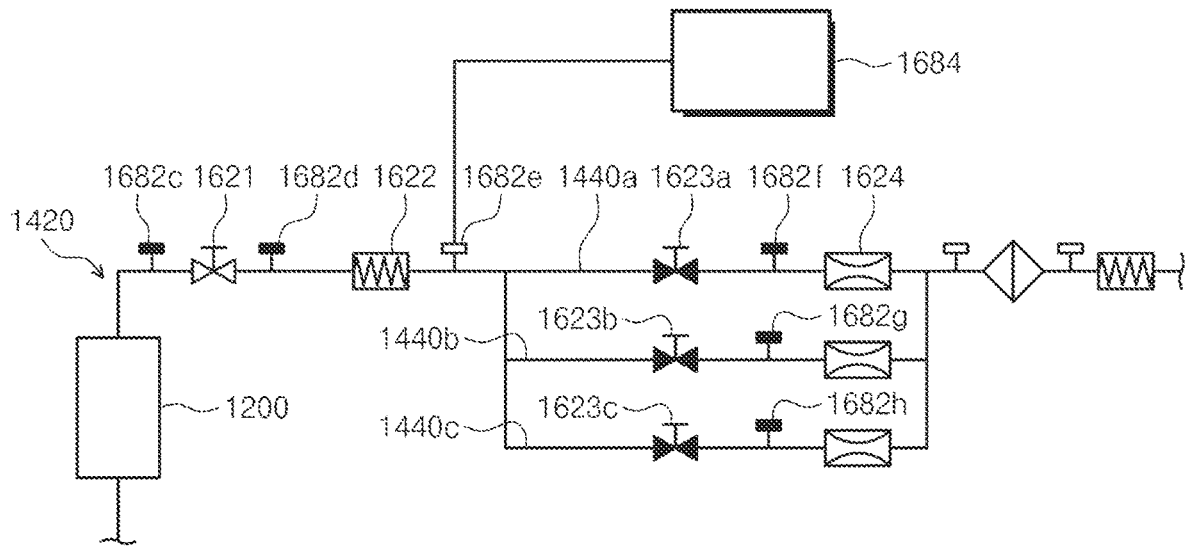

As illustrated in FIG. 11, metal particles are detected by connecting the inspecting device 1684 to the third detection port 1682e closest to the first heater 1622 downstream the first heater 1622. In order to determine the defectiveness of the first valve 1621, whether or not the first heater 1622 is defective is determined based on the second detection value detected from the second detection port 1682d and the third detection value detected from the third detection port 1682e. When it is determined that the first heater 1622 is defective, the inspection is stopped and the first heater 1622 is replaced. When it is determined that the first heater 1622 is good, the second valve 1623a installed in the first flow rate selection line 1440a is selected as an inspected component.

Figure 12:
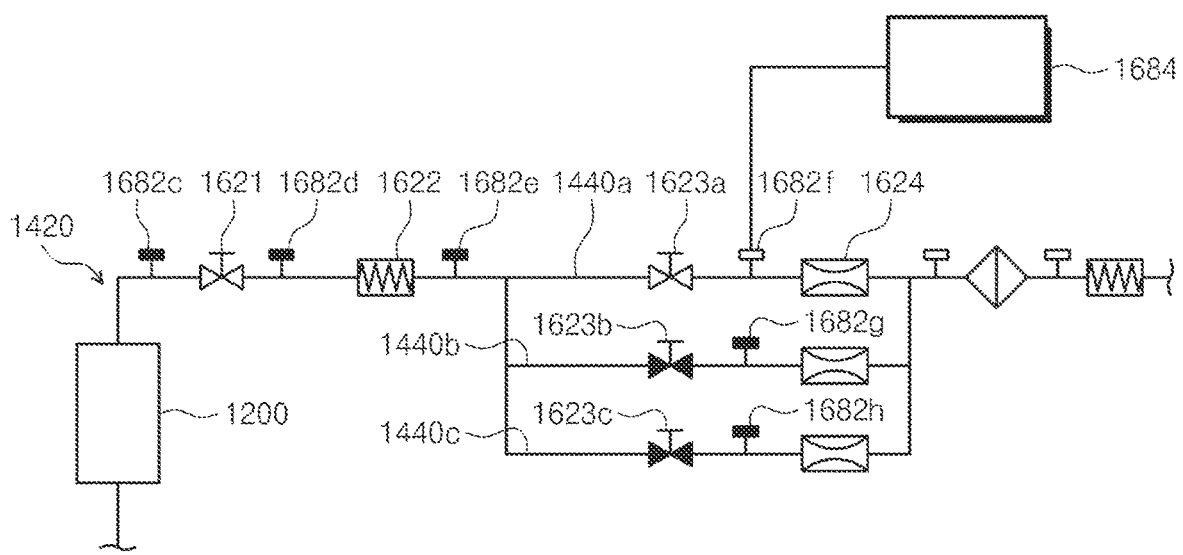

Thereafter, as illustrated in FIG. 12, metal particles are detected by connecting the inspecting device 1684 to the fourth detection port 1682f closest to the second valve 1623a downstream the second valve 1623*a*. In order to determine the defectiveness of the first heater 1622, whether or not the second valve 1623*a* is defective is determined based on the third detection value detected from the third detection port 1682*e* and the fourth detection value detected from the fourth detection port 1682*f*. The above process is sequentially performed for all the components 1620 installed in the fluid supply line 1400.

In the case wherein the substrate is determined to be defective due to the metal particles and the above defect inspection is performed in the process of inspecting the substrate, when it is determined that all the components 1620 installed in the fluid supply line 1400 are good, it is determined that the metal particles are generated in the pipe or the housing for treating the substrate, and the connection line 2420 connecting the components 1620 or the housing is replaced.

Figure 13:
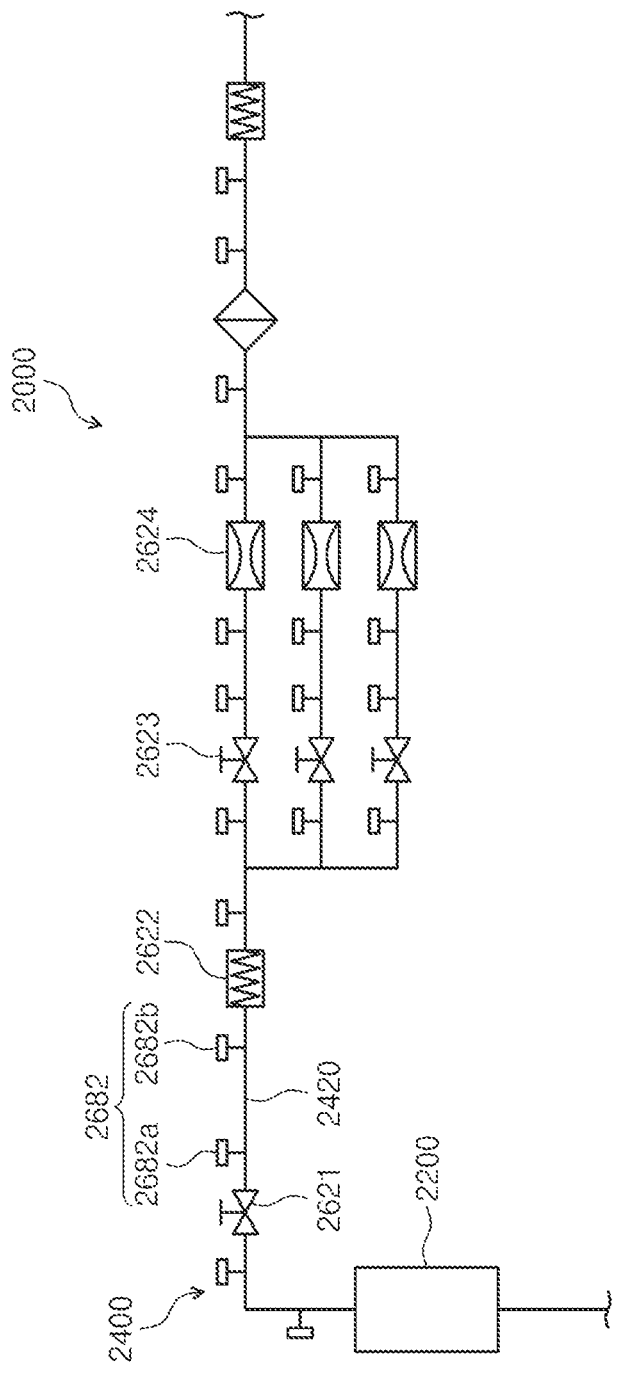
FIG. 13 is a diagram schematically illustrating another exemplary embodiment of the fluid supply unit of FIG. 5.

FIG. 13 is a diagram schematically illustrating another exemplary embodiment of the fluid supply unit of FIG. 5.

Referring to FIG. 13, components 2620 adjacent in a fluid supply line 2400 are connected by a connection line 2420. Each connection line 2420 is provided with two detection ports 2682. A first detection port 2682*a*, which is one of the detection ports 2682, is located adjacent to the component 2620 provided upstream, and a second detection port 2682*b*, which is the other one, is adjacent to the component 2620 provided downstream. When a metal foreign material is released from the connection line 2420, the liquid supply unit 2000 of FIG. 13 may detect from which connection line 2420 among the plurality of connection lines 2420 the metal foreign material is released.

Figure 14:
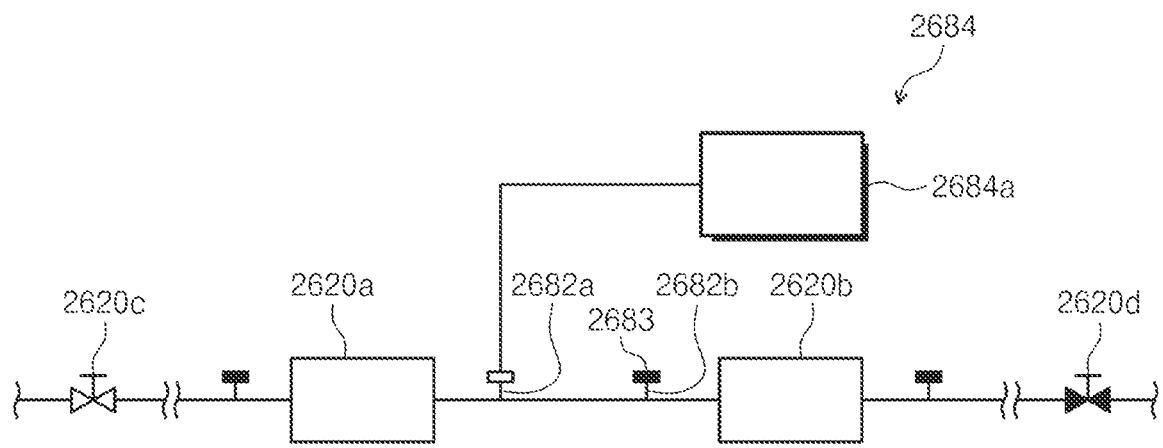
FIGS. 14 and 15 are diagrams illustrating a process of detecting whether a metal foreign material is released from a connection line connecting adjacent components.
Figure 15:
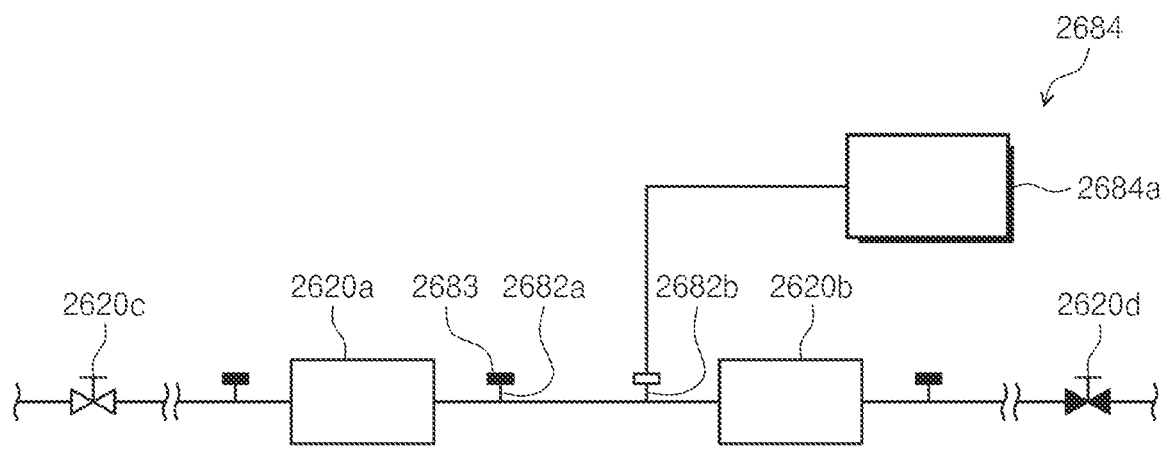

FIGS. 14 and 15 are diagrams illustrating a process of detecting whether a metal foreign material is released from the connection line connecting adjacent components. In FIGS. 14 and 15, the valve with the filled inside is in a closed state, and the valve with the empty inside is in an open state. In addition, an end of the detection port with the filled inside is in a closed state, and an end of the detection port with an empty inside is in an open state. Hereinafter, the connection line 2420 for performing the inspection is referred to as an inspected line 2420*a*.

First, a coupling port of an inspecting device 2684 is connected to the first detection port 2682*a*, and the second detection port 2682*b* is closed with a cap 2683. Among the valves located downstream from the second detection port 2682*b*, the valve 2620*d* closest to the second detection port 2682*b* is closed. Thereafter, a fluid for inspection is supplied from a supply tank 2200 to the fluid supply line 2400. Some of the fluids for inspection is introduced into the measuring unit 2684*a* of a detector 2684 through the first detection port 2682*a*, and the measuring unit 2684*a* detects metal particles. Thereafter, the first detection port 2682*a* is closed with the cap 2683, and a coupling port 2684*c* of the testing device 2684 is connected to the second detection port 2682*b*. A part of the fluid for inspection is introduced into the measuring unit 2684*a* through the second detection port 2682*b*, and the measuring unit 2684*a* detects metal particles from the fluid for inspection. It is determined whether the inspected line 2420*a* is defective based on a first detection value detected through the first detection port 2682*a* and a second detection value detected through the second detection port 2682*b*.

According to an example, the inspection order of the inspected line 2420*a* may be determined by the following method.

Among the connection lines 2420, the connection line 2420 closest to the supply tank 2200 is selected as a first inspected line to check whether there is a defect. When it is determined that the first inspected line is defective, the inspection is stopped and the first inspected line is replaced with a new connection line 2420. When it is determined that the first inspected line is good, the connection line 2420 closest to the first inspected line in the downstream direction of the fluid supply line 2400 is selected as a second inspected line to check whether the second inspected line is defective. The above process is repeated for all the connection lines 2420 provided to the fluid supply line 2400 until the connection line 2420 determined to be defective among the connection lines 2420 is found.

Optionally, by combining the connection line 2420 and the component 2620, the inspection may be sequentially performed by selecting any one of the connection line 2420 and the component 2620 in the order adjacent to the supply tank 2200. For example, in the case of FIG. 13, the target for inspection may be determined in the order from the first connection line 2420 connecting the supply tank 2200 and the first valve 2621, the first valve 2621, the second connection line connecting the first valve 2521 and the first heater 2622, and the first heater 2622.

Hereinafter, a method of treating a substrate by using the above-described substrate treating apparatus will be described. The substrate treating method includes a substrate treating operation and a detection operation. Once the substrate is loaded into the body of the drying chamber, a substrate treating operation is performed. In the substrate treating operation, the substrate is processed by supplying a supercritical fluid to a treatment space through a fluid supply line. Thereafter, when a detection condition for whether there is a defective component releasing a metal foreign material among the components installed in the fluid supply line is satisfied, a detection operation is performed. After the substrate treating operation, an inspection operation of inspecting whether metal particles remain on the substrate is performed, and when the metal particles remain on the substrate more than a set value in the inspection operation, the detection condition may be set to be satisfied. Optionally, the detection condition may be the amount of time the substrate treating apparatus is used to treat the substrates or the number of substrates treated by the substrate treating apparatus.

In the detection operation, it is detected whether metal particles are released from the component 1620 including the metal among the components 1620 installed in the fluid supply line 1400. The detection operation includes a first component inspection operation and a second component inspection operation.

In the first component inspection operation, whether metal particles are released from the first component is detected. The first component inspection operation includes a first detection operation, a second detection operation, and a first determination operation. In the first detection operation, an inspecting device is connected to a first detection port installed in the fluid supply line upstream from the first component, and metal particles are detected from the fluid for inspection before passing through the first component to obtain a first detection value. In the second detection operation, an inspecting device is connected to a second detection port installed in the fluid supply line downstream from the first component, and metal particles are detected from the fluid for inspection after passing through the first component to obtain a second detection value. In the first determination operation, it is determined whether the first component is defective based on the first detection value and the second detection value.

If the first component is determined to be a good product in the first component inspection operation, the second component inspection operation is performed.

The second component inspection operation detects whether metal particles are released from the second component. The second component inspection operation includes a third detection operation, a fourth detection operation, and a second determination operation. In the third detection operation, an inspecting device is connected to a third detection port installed in the fluid supply line upstream from the second component among the detection ports installed in the fluid supply line, and metal particles are detected from the fluid for inspection before passing through the second part to obtain a third detection value. In the fourth detection operation, the inspecting device is connected to a fourth detection port installed in the fluid supply line downstream from the second component among the detection ports installed in the fluid supply line, and metal particles are detected from the fluid for inspection after passing through the second component to obtain a fourth detection value. In the second determination operation, it is determined whether the second component is defective based on the third detection value and the fourth detection value.

When the second component is disposed downstream from the first component in the fluid supply line, and no other component is provided between the first component and the second component, the second component inspection operation may be performed as follows. The second component inspection operation includes a third detection operation and a second determination operation. In the third detection operation, an inspecting device is connected to a third detection port installed in the fluid supply line downstream from the second component among the detection ports installed in the fluid supply line, and metal particles are detected from the fluid for inspection after passing through the second component to obtain a third detection value. In the second determination operation, it is determined whether the second component is defective based on the second detection value and the third detection value.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
   a chamber having a treatment space treating a substrate; and
   a treatment fluid supply unit supplying a treatment fluid to the treatment space,
   wherein the treatment fluid supply unit includes:
      a supply tank in which the treatment fluid is stored;
      a treatment fluid supply line connecting the supply tank and the chamber and supplying the treatment fluid from the supply tank to the chamber;
      a first component installed in the treatment fluid supply line, wherein the first component includes a valve;
      a second component installed in the treatment fluid supply line; and
      a detection member detecting whether or not metal particles are released from at least one of the first component or the second component, and
   the detection member includes:
      an upstream detection port connected to the treatment fluid supply line upstream from the first component;
      a first downstream detection port connected to the treatment fluid supply line between the first component and the second component;
      a second downstream detection port connected to the treatment fluid supply line downstream of the second component; and
      an inspecting device provided to be coupled to a selected detection port between the upstream detection port, the first downstream detection port, and the second downstream detection port, and detecting metal particles generated by the first component from the treatment fluid flowing through the selected detection port from the treatment fluid supply line, wherein the inspecting device consists of a measuring unit, a single inlet line, and a single coupling port,
   wherein no other component is provided between the upstream detection port and the first component, between the first component and the first downstream detection port, between the first downstream detection port and the second component, and between the second component and the second downstream detection port,
   wherein the single inlet line is detachably connected to the upstream detection port, the first downstream detection port or the second downstream detection port by the coupling port, and
   each of the upstream detection port, the first downstream detection port and the second downstream detection port has a cap blocking an end thereof in a state in which the inspecting device is separated.

2. The substrate treating apparatus of claim 1, wherein the first component and the second component include a pump, a filter, or an orifice.

3. The substrate treating apparatus of claim 1, wherein in the first component and the second component, a surface exposed to a passage through which the treatment fluid flows contains a metal, or in the first component and the second component, a metal surface is coated with a material other than metal.

4. The substrate treating apparatus of claim 3, wherein the chamber includes a high-pressure vessel, and
   the treatment fluid is a supercritical fluid.

5. A substrate treating apparatus, comprising:
   a chamber having a treatment space treating a substrate; and
   a treatment fluid supply unit supplying a supercritical fluid to the treatment space,
   wherein the treatment fluid supply unit includes:
      a supply tank in which treatment fluid is stored;
      a treatment fluid supply line connecting the supply tank and the chamber and supplying the treatment fluid from the supply tank to the chamber;
      a first component installed in the treatment fluid supply line and made of a material containing metal;
      a second component installed in the treatment fluid supply line; and a detection member detecting whether or not metal particles are released from at least one of the first component or the second component, and the detection member includes:

an upstream detection port connected to the treatment fluid supply line upstream from the first component;

a first downstream detection port connected to the treatment fluid supply line between the first component and the second component;

a second downstream detection port connected to the treatment fluid supply line downstream of the second component; and an inspecting device provided to be coupled to a selected detection port between the upstream detection port, the first downstream detection port, and the second downstream detection port, and detecting metal particles from the treatment fluid flowing through the selected detection port from the treatment fluid supply line, wherein the inspecting device consists of a measuring unit, a single inlet line, and a single coupling port, and wherein no other component is provided between the upstream detection port and the first component, between the first component and the first downstream detection port, between the first downstream detection port and the second component, and between the second component and the second downstream detection port.

6. The substrate treating apparatus of claim 5, wherein the first component and the second component include a valve, a pump, a filter, or an orifice.

7. The substrate treating apparatus of claim 5, wherein the inspecting device is detachably provided to the upstream detection port, the first downstream detection port and the second downstream detection port, and each of the upstream detection port, the first downstream detection port and the second downstream detection port has a cap blocking an end thereof in a state in which the inspecting device is separated.

* * * * *